United States Patent
Park et al.

(10) Patent No.: US 10,103,648 B2
(45) Date of Patent: Oct. 16, 2018

(54) ENERGY HARVESTER

(71) Applicant: Samsung Electronics Co., Ltd., Suwon-si (KR)

(72) Inventors: Young-jun Park, Suwon-si (KR); Yun-kwon Park, Dongducheon-si (KR)

(73) Assignee: Samsung Electronics Co., Ltd. (KR)

( * ) Notice: Subject to any disclaimer, the term of this patent is extended or adjusted under 35 U.S.C. 154(b) by 441 days.

(21) Appl. No.: 15/010,913

(22) Filed: Jan. 29, 2016

(65) Prior Publication Data
US 2016/0233792 A1     Aug. 11, 2016

(30) Foreign Application Priority Data

Feb. 11, 2015   (KR) .................. 10-2015-0020969

(51) Int. Cl.
| | |
|---|---|
| *H02N 1/04* | (2006.01) |
| *G04G 19/00* | (2006.01) |
| *G04C 10/00* | (2006.01) |
| *H01L 37/02* | (2006.01) |

(52) U.S. Cl.
CPC .............. *H02N 1/04* (2013.01); *G04C 10/00* (2013.01); *G04G 19/00* (2013.01); *H01L 37/02* (2013.01)

(58) Field of Classification Search
CPC .......... H01N 1/04; G04C 10/00; G04C 19/00; H01L 37/02; H01L 37/00
USPC .................................................. 310/306, 300
See application file for complete search history.

(56) References Cited

U.S. PATENT DOCUMENTS

| | | | |
|---|---|---|---|
| 8,519,596 B1 | 8/2013 | Kim et al. | |
| 8,803,401 B2 | 8/2014 | Hiroshi et al. | |
| 9,444,031 B2* | 9/2016 | Park | H01L 41/113 |
| 9,553,527 B1* | 1/2017 | Carneiro | H02N 11/002 |
| 9,786,718 B1* | 10/2017 | Boyd | H01L 27/16 |
| 9,837,933 B2* | 12/2017 | Park | H01L 41/113 |
| 2009/0295257 A1* | 12/2009 | Wang | H01G 9/2068 |
| | | | 310/367 |
| 2011/0050181 A1 | 3/2011 | Post et al. | |
| 2013/0049531 A1 | 2/2013 | Wang et al. | |
| 2014/0174496 A1 | 6/2014 | Park et al. | |

(Continued)

FOREIGN PATENT DOCUMENTS

| | | |
|---|---|---|
| JP | 5063816 B2 | 10/2012 |
| KR | 1020120133581 | 12/2012 |
| KR | 10-1398708 B1 | 5/2014 |

OTHER PUBLICATIONS

Notification with International Search Report dated Apr. 22, 2016 corresponding to International Patent Application No. PCT/KR2016/000621.

*Primary Examiner* — Forrest M Phillips
(74) *Attorney, Agent, or Firm* — McAndrews, Held & Malloy, Ltd.

(57) ABSTRACT

An energy harvester is provided. The energy harvester includes a first friction member, and a second friction member arranged to face the first friction member and generating electrical energy by causing friction with the first friction member. At least one of the first friction member and the second friction member includes a pyroelectric material converting frictional heat generated due to friction of the first and second friction members into electrical energy. While the energy harvester generates electrical energy by triboelectrification, the energy harvester may convert frictional heat into electrical energy by using a pyroelectric material.

20 Claims, 14 Drawing Sheets

(56) References Cited

U.S. PATENT DOCUMENTS

| | | | |
|---|---|---|---|
| 2015/0001993 A1* | 1/2015 | Park | H01L 41/113 |
| | | | 310/319 |
| 2015/0061460 A1* | 3/2015 | Bae | H02N 1/04 |
| | | | 310/310 |
| 2015/0194911 A1* | 7/2015 | Kim | H02N 1/04 |
| | | | 310/310 |
| 2015/0349664 A1* | 12/2015 | Zhang | H02N 1/04 |
| | | | 310/310 |
| 2016/0156282 A1* | 6/2016 | Kim | H02N 1/04 |
| | | | 607/61 |
| 2016/0370536 A1* | 12/2016 | Tan | G02B 6/0065 |
| 2017/0236990 A1* | 8/2017 | Park | H01L 37/02 |
| | | | 310/306 |

* cited by examiner

ENERGY HARVESTER

RELATED APPLICATION(S)

This application claims the benefit of Korean Patent Application No. 10-2015-0020969, filed on Feb. 11, 2015, in the Korean Intellectual Property Office, the disclosure of which is incorporated herein in its entirety by reference.

BACKGROUND

The present disclosure relates to energy harvesters, and more particularly, to energy harvesters using triboelectrification and a pyroelectric effect.

With the recent rapid increase in the use of smartphones, various attempts are being made to develop a method of mutually controlling a smartphone and a peripheral device. In particular, research into smartwatches, which are combinations of smartphones and watches, is being actively conducted, and some prototypes are being commercialized. Smartwatches are used to control or monitor functions of smartphones, such as making a phone call, texting, and using an application. The smartwatches consume more power compared to general watches and therefore have to be frequently charged or mounted with high capacity batteries in order to have power supplied continuously.

SUMMARY

According to an aspect of an exemplary embodiment, an energy harvester includes a first friction member, and a second friction member arranged to face the first friction member and configured to generate electrical energy by causing friction with the first friction member, wherein at least one selected from the first friction member and the second friction member includes a pyroelectric material configured to convert frictional heat generated due to friction of the first and second friction members into electrical energy.

At least one selected from the first and second friction members may slide along opposite surfaces of the first and second friction members, thereby causing friction.

At least one selected from the first and second friction members may move in a direction substantially perpendicular to opposite surfaces of the first and second friction members and thus may repeat contact and non-contact, thereby causing friction.

The second friction member may include the pyroelectric material, and a first electrode and a second electrode may be respectively arranged on both end portions of the second friction member.

The pyroelectric material may include at least one of poly vinylidene fluoride (PVDF), poly(vinyl chloride) (PVC), polyvinyl fluoride (PVF), tri glycerin sulphate (TGS), lead zirconate titanate (PZT), lead stannic titanate (PST), lithium tantalate (LiTaO$_3$), barium titanate (BaTiO$_3$), composites thereof, and zinc oxide (ZnO).

In order to quickly react to temperature changes, the second friction member may be in a form of a nanoparticle, a nanowire, or a nanotube, may be in a form including the nanoparticle, the nanowire, and the nanotube, or may have a structure in which a specific surface area having a surface texturing shape is large.

The second friction member may be configured such that polarization occurs, due to frictional heat, in a direction substantially parallel to opposite surfaces of the first and second friction members.

The first friction member may include a metal, and a third electrode may be arranged on the second friction member.

The first friction member may include a dielectric layer in which a plurality of protrusions are formed in a direction facing the second friction member, and a plurality of third electrodes may be arranged on the first friction member.

The third electrodes may include a plurality of first sub-electrodes electrically connected to each other, and a plurality of second sub-electrodes arranged between the first sub-electrodes and electrically connected to each other.

The first friction member may include a dielectric layer, a third electrode may be arranged on the first friction member, and a fourth electrode may be arranged on the second friction member.

According to an aspect of another exemplary embodiment, an energy harvester includes a pyroelectric material layer configured to generate electrical energy by frictional heat, a first electrode and a second electrode respectively arranged on both surfaces of the pyroelectric material layer, a friction member configured to generate electrical energy by causing friction with the second electrode, and a plurality of third electrodes arranged on the friction member.

The third electrodes may include a plurality of first sub-electrodes electrically connected to each other, and a plurality of second sub-electrodes arranged between the first sub-electrodes and electrically connected to each other.

The friction member may include a first dielectric layer in which a plurality of protrusions are formed in a direction facing the second electrode.

The friction member may include a plurality of second dielectric layers arranged between the protrusions of the first dielectric layer and having an electrification rate different from that of the first dielectric layer.

The pyroelectric material layer may include at least one selected from poly vinylidene fluoride (PVDF), poly (vinyl chloride) (PVC), polyvinyl fluoride (PVF), tri glycerin sulphate (TGS), lead zirconate titanate (PZT), lead stannic titanate (PST), lithium tantalate (LiTaO$_3$), barium titanate (BaTiO$_3$), polymer-ceramic composites, and zinc oxide (ZnO).

In order to quickly react to temperature changes, the pyroelectric material layer may be in a form of a nanoparticle, a nanowire, or a nanotube, may be in a form including the nanoparticle, the nanowire, and the nanotube, or may have a structure in which a specific surface area having a surface texturing shape is large.

According to an aspect of another exemplary embodiment, a smartwatch includes: an energy harvester including a first friction member, and a second friction member arranged to face the first friction member and configured to generate electrical energy by causing friction with the first friction member; and a transmission circuit configured to transmit the electrical energy generated from the energy harvester to outside of the energy harvester, wherein at least one selected from the first friction member and the second friction member includes a pyroelectric material configured to convert frictional heat generated due to friction of the first and second friction members into electrical energy.

The transmission circuit may include a converter configured to convert an alternating current (AC) signal into a direct current (DC) signal, a controller configured to adjust impedance of the transmission circuit such that a transmission rate of power transmitted through the transmission circuit is increased, and a step down converter configured to adjust a level of a DC voltage obtained by the converting performed by the converter.

The second friction member may include the pyroelectric material, and a first electrode and a second electrode may be respectively arranged on both end portions of the second friction member.

According to an aspect of another exemplary embodiment, a smartwatch includes: an energy harvester including a pyroelectric material layer configured to generate electrical energy by frictional heat, a first electrode and a second electrode respectively arranged on both surfaces of the pyroelectric material layer, a friction member configured to generate electrical energy by causing friction with the second electrode, and a plurality of third electrodes arranged on the friction member; and a transmission circuit configured to transmit the electrical energy generated from the energy harvester to outside of the energy harvester.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION

Figure 1:
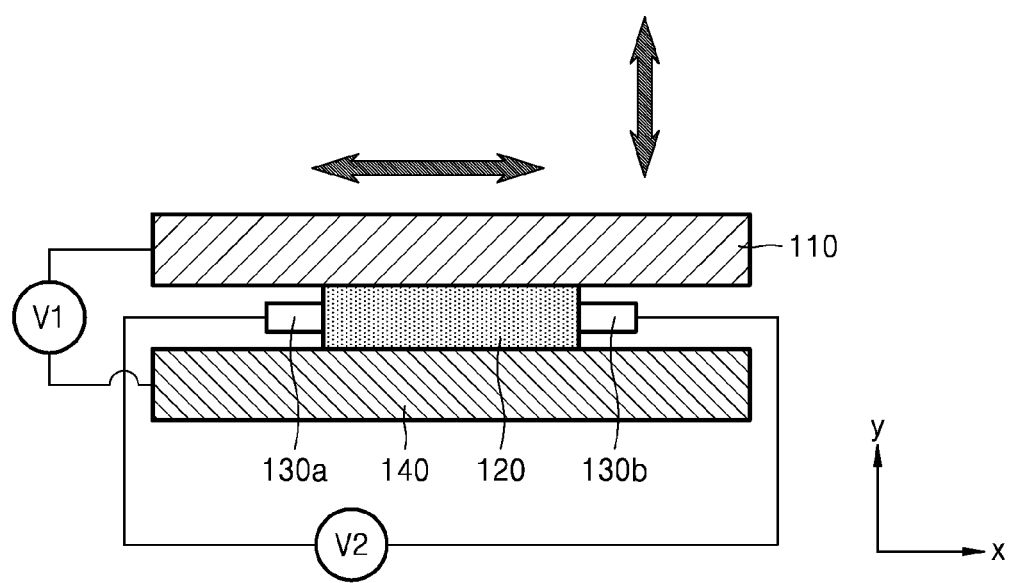
FIG. 1 is a cross-sectional view of an energy harvester according to an exemplary embodiment.

Reference will now be made in detail to exemplary embodiments, examples of which are illustrated in the accompanying drawings, wherein like reference numerals refer to like elements throughout, and sizes or thicknesses of elements may be exaggerated for clarity of description. It will also be understood that when a material layer is referred to as being on a substrate or another layer, the material layer may be directly on the substrate or the other layer, or an intervening layer may be present therebetween. In addition, in the following exemplary embodiments, a material used to form each layer is an example, and accordingly, another material may be used alternatively. Expressions such as "at least one of," when preceding a list of elements, modify the entire list of elements and do not modify the individual elements of the list.

FIG. 1 is a cross-sectional view of an energy harvester according to an exemplary embodiment.

Referring to FIG. 1, the energy harvester according to the present exemplary embodiment may include a first friction member 110 and a second friction member 120. The second friction member 120 may be arranged to face the first friction member 110 and may cause triboelectrification to occur with respect to the first friction member 110. For this, at least one of the first friction member 110 and the second friction member 120 may move with respect to the other and thus may cause friction. When there is friction between the first friction member 110 and the second friction member 120, electrical energy may be generated through triboelectrification. A principle of triboelectrification will be described later with reference to FIGS. 2 and 3. At least one of the first friction member 110 and the second friction member 120 may include a pyroelectric material for converting frictional heat generated by the first friction member 110 and the second friction member 120 into electrical energy. In the pyroelectric material, as an arrangement direction of an internal dipole moment changes due to frictional heat generated by the first friction member 110 and the second friction member 120, an electric charge may be induced on a surface of the pyroelectric material. Thus, the pyroelectric material may convert thermal energy into electrical energy.

According to the present exemplary embodiment illustrated in FIG. 1, the first friction member 110 may include a metal. The metal may include, for example, at least one of aluminum (Al), magnesium (Mg), copper (Cu), lead, iron (Fe), nickel (Ni), silver (Ag), platinum (Pt), gold (Au), and an alloy thereof. However, the above-described materials are just examples, and the metal is not limited thereto. The second friction member 120 may include a pyroelectric material. The pyroelectric material may include, for example, at least one of poly vinylidene fluoride (PVDF), poly(vinyl chloride) (PVC), polyvinyl fluoride (PVF), tri glycerin sulphate (TGS), lead zirconate titanate (PZT), lead stannic titanate (PST), lithium tantalate (LiTaO$_3$), barium titanate (BaTiO$_3$), polymer-ceramic composites, and zinc oxide (ZnO), but is not limited thereto. Also, the second friction member 120 including the pyroelectric material may be in a form of a nanoparticle, a nanowire, or a nanotube, may be in a form including the nanoparticle, the nanowire, and the nanotube, or may have a structure in which a specific surface area having a surface texturing shape is large in order to quickly react to temperature changes.

A first electrode 130$a$ and a second electrode 130$b$ may be provided on both end portions of the second friction member 120. When a temperature of the second friction member 120 changes due to frictional heat, electric charges having different polarities from each other may be respectively induced in the two end portions of the second friction member 120. That is, at the second friction member 120, polarization may occur in a direction substantially parallel to opposite surfaces of the first friction member 110 and the second friction member 120 (a direction substantially parallel to the x-axis) due to frictional heat. When the polarization occurs, the dipole moment may be arranged in the direction substantially parallel to the x-axis at the second friction member 120.

A third electrode 140 may be provided proximate the second friction member 120. The third electrode 140 may be provided on the opposite side of a surface of the second friction member 120 that faces the first friction member 110. As the first friction member 110 and the second friction member 120 cause triboelectrification to occur, there may be a potential difference between the third electrode 140 and the first friction member 110. Also, electrical energy may be produced from the potential difference between the third electrode 140 and the first friction member 110.

The first electrode 130a, the second electrode 130b, and the third electrode 140 may include a conductive material. The conductive material may include at least one of a metal, graphene, a carbon nanotube (CNT), indium tin oxide (ITO), and a conductive polymer, but is not limited thereto. The metal may include, for example, at least one of Al, Mg, Cu, lead, Fe, Ni, Ag, Pt, Au, and an alloy thereof, and the conductive polymer may include, for example, PCBM ([6, 6]-phenyl-C85 butyric acid methyl ester). However, the above-described materials are just examples, and the metal and the conductive polymer are not limited thereto.

Figure 2:
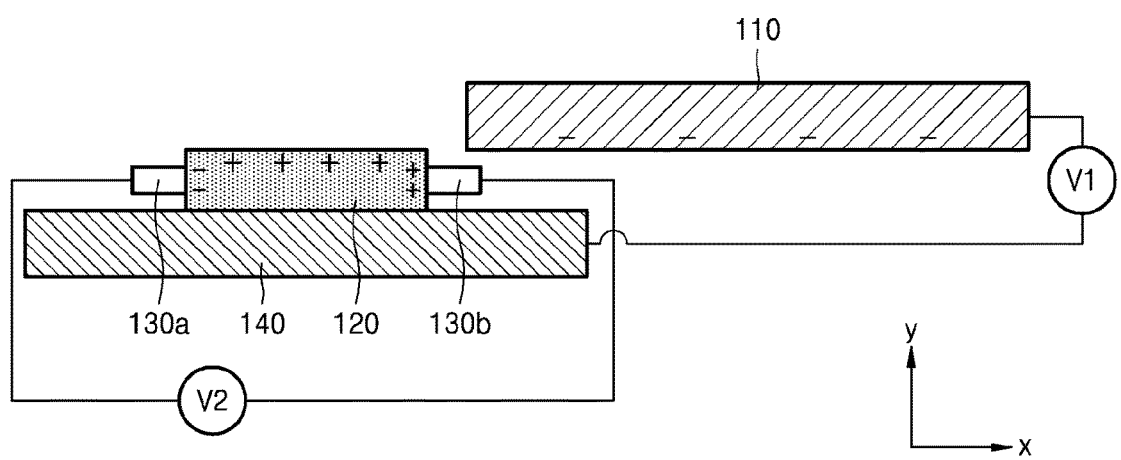
FIG. 2 illustrates an example of generating, by the energy harvester of FIG. 1, electrical energy.

FIG. 2 illustrates an example of generating, by the energy harvester of FIG. 1, electrical energy.

Referring to FIG. 2, at least one of the first friction member 110 and the second friction member 120 may slide along opposite surfaces of the first friction member 110 and the second friction member 120, thereby causing friction. For example, at least one of the first friction member 110 and the second friction member 120 may move in a direction substantially parallel to the x-axis of FIG. 2. In this case, the first friction member 110 may be fixed, and only the second friction member 120 may move in the direction substantially parallel to the x-axis. Conversely, the second friction member 120 may be fixed, and only the first friction member 110 may move in the direction substantially parallel to the x-axis. Alternatively, both of the first friction member 110 and the second friction member 120 may move in the direction substantially parallel to the x-axis. In this regard, the description, "may move in the direction substantially parallel to the x-axis" is to be construed as meaning that it is sufficient as long as a moving direction component includes an x-axis component. That is, the moving direction component is not limited to including only the x-axis component. For example, at least one of the first friction member 110 and the second friction member 120 may move in the x-axis direction and at the same time, may move in the y-axis direction or in a direction substantially perpendicular both to the x-axis and the y-axis.

When at least one of the first friction member 110 and the second friction member 120 moves, friction may occur between the first friction member 110 and the second friction member 120. Due to the friction, the first friction member 110 and the second friction member 120 may be electrified or energized to have different polarities from each other. Also, as a distance between the first friction member 110 and the second friction member 120 changes, the amount of electrification charges in the first friction member 110 and the second friction member 120 may change. Thus, an electric current may flow between the first friction member 110 and the third electrode 140, thereby producing electrical energy due to triboelectrification. For effective triboelectrification, as illustrated in FIG. 2, the first friction member 110 and the second friction member 120 may repeat a process of being brought into and out of contact with each other by the above-described sliding process.

When there is friction between the first friction member 110 and the second friction member 120, a temperature of the second friction member 120 may increase due to frictional heat. When the temperature of the second friction member 120 increases, as illustrated in FIG. 2, in a pyroelectric material of the second friction member 120, polarization may occur in a direction substantially parallel to the x-axis. Due to the polarization, for example, positive (+) charge may be induced in one end of the second friction member 120, and negative (−) charge may be induced in the other end of the second friction member 120. The second electrode 130b provided on a side of the second friction member 120 where the positive (+) charge has been induced may have a higher potential than the first electrode 130a provided on a side of the second friction member 120 where the negative (−) charge has been induced. Accordingly, an electric current may flow from the second electrode 130b to the first electrode 130a, thereby producing electrical energy. Also, when a temperature of the second friction member 120 decreases when there is no friction between the first friction member 110 and the second friction member 120, an amount of electric charges induced in the two ends of the second friction member 120 may decrease, and due to this, a potential difference may be produced again between the first electrode 130a and the second electrode 130b, thereby producing electrical energy.

Figure 3:
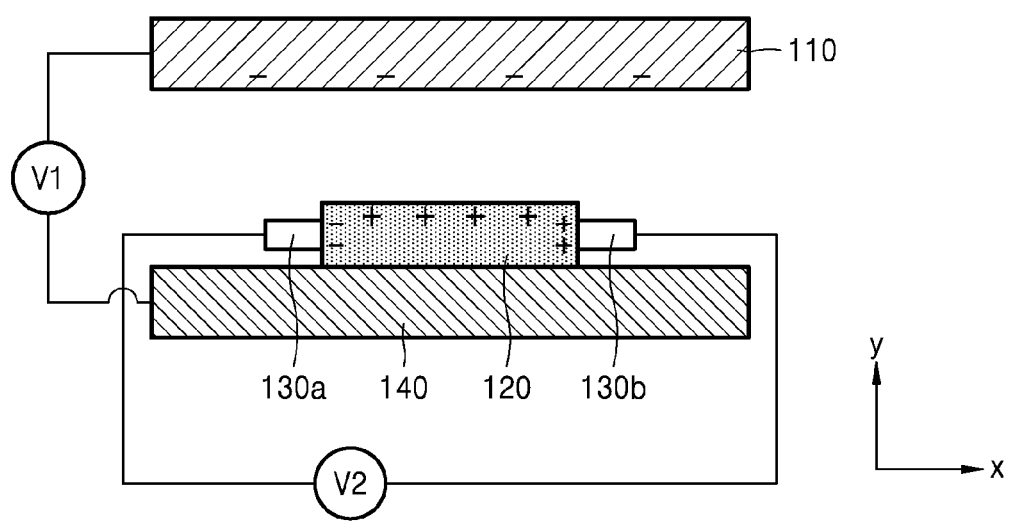
FIG. 3 illustrates an example of generating, by the energy harvester of FIG. 1, electrical energy.

FIG. 3 illustrates an example of generating, by the energy harvester of FIG. 1, electrical energy.

Referring to FIG. 3, at least one of the first friction member 110 and the second friction member 120 may move in a direction substantially perpendicular to opposite surfaces of the first friction member 110 and the second friction member 120. Also, the first friction member 110 and the second friction member 120 may repeat contact and non-contact, thereby causing friction. For example, at least one of the first friction member 110 and the second friction member 120 may move in a direction substantially parallel to the y-axis of FIG. 3. In this case, the first friction member 110 may be fixed, and only the second friction member 120 may move in the direction substantially parallel to the y-axis. Reversely, the second friction member 120 may be fixed, and only the first friction member 110 may move in the direction substantially parallel to the y-axis. Alternatively, both of the first friction member 110 and the second friction member 120 may move in the direction substantially parallel to the y-axis. In this regard, the description, "may move in a (or the) direction substantially parallel to the y-axis" has to be construed as meaning that it is sufficient as long as a moving direction component includes a y-axis component. That is, the moving direction component is not limited to including only the y-axis component. For example, at least one of the first friction member 110 and the second friction member 120 may move in the y-axis direction and at the same time, may move in the x-axis direction or in a direction substantially perpendicular both to the x-axis and the y-axis.

When at least one of the first friction member 110 and the second friction member 120 moves, friction may occur between the first friction member 110 and the second friction member 120. Due to the friction, the first friction member 110 and the second friction member 120 may be electrified or energized to have different polarities from each other. Also, as a distance between the first friction member 110 and the second friction member 120 changes, an amount of electrification charges in the first friction member 110 and the second friction member 120 may change. Thus, an electric current may flow between the first friction member 110 and the third electrode 140, thereby producing electrical energy due to triboelectrification.

When the first friction member 110 and the second friction member 120 cause frictions, a temperature of the second friction member 120 may increase due to frictional heat. When the temperature of the second friction member 120 increases, as illustrated in FIG. 3, in a pyroelectric material of the second friction member 120, polarization may occur in a direction substantially parallel to the x-axis. Due to the polarization, for example, positive (+) charge may be induced in one end of the second friction member 120, and negative (−) charge may be induced in the other end of the second friction member 120. The second electrode 130b provided on a side of the second friction member 120 where the positive (+) charge has been induced may have a higher potential than the first electrode 130a provided on a side of the second friction member 120 where the negative (−) charge has been induced. Accordingly, an electric current may flow from the second electrode 130b to the first electrode 130a, thereby producing electrical energy. Also, when a temperature of the second friction member 120 decreases when the first friction member 110 and the second friction member 120 cause no friction, an amount of electric charges induced in the two ends of the second friction member 120 may decrease. Due to this, a potential difference may occur again between the first electrode 130a and the second electrode 130b, and thus, an electric current may flow through.

Figure 4:
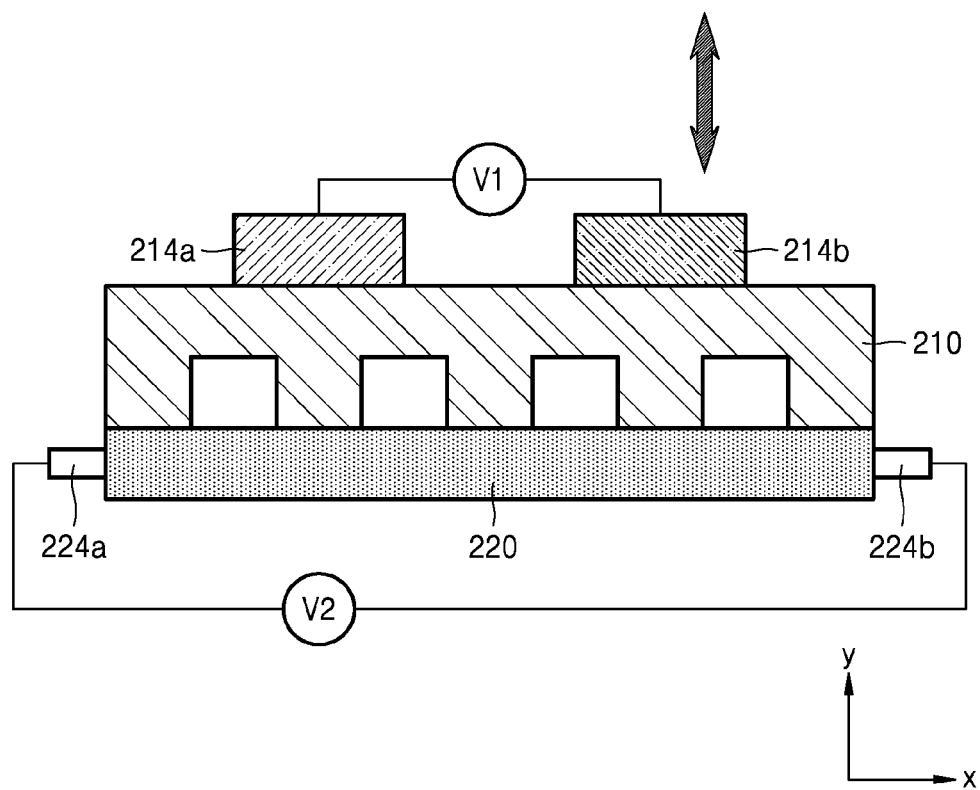
FIG. 4 is a cross-sectional view of an energy harvester according to another exemplary embodiment.

FIG. 4 is a cross-sectional view of an energy harvester according to another exemplary embodiment.

Referring to FIG. 4, the energy harvester according to the present exemplary embodiment may include a first friction member 210 and a second friction member 220. The second friction member 220 may include a pyroelectric material. Also, a first electrode 224a and a second electrode 224b may be provided on both end portions of the second friction member 220. The first friction member 210 may include a dielectric layer in which a plurality of protrusions are formed in a direction of facing the second friction member 220. Also, a plurality of third electrodes 214a and 214b may be provided on the first friction member 210. The third electrodes 214a and 214b may be provided on the opposite side of a surface of the second friction member 220 that faces the first friction member 210. When the first friction member 210 and the second friction member 220 cause triboelectrification, a potential difference may occur between the third electrodes 214a and 214b. In addition, electrical energy may be produced or generated from the potential difference between the third electrodes 214a and 214b.

The dielectric layer included in the first friction member 210 may include at least one of a piezoelectric material, a ferroelectric material, an electric active polymer (EAP), and a pyroelectric material, and is not limited thereto. Also, the dielectric layer may include, for example, polyformaldehyde, ethylcellulose, polyamide, wool, silk, paper, cotton, steel, wood, polyvinyl alcohol (PVA), silicon rubber, Teflon, polydimethylsiloxane (PDMS), Kapton, polyethylene (PE), PVC, a fluoropolymer (e.g., PVF), PVDF, polytetrafluoroethylene (PTFE), polychlorotrifluoroethylene (PCTFE), perfluoroalkoxy polymer (PFA), fluorinated ethylene-propylene (FEP), polyethylenetetrafluoroethylene (ETFE), polypropylene (PP), polyethyleneterephthalate (PET), quartz, PZT, ZnO, and barium tin oxide (BTO), but is not limited thereto.

Figure 5:
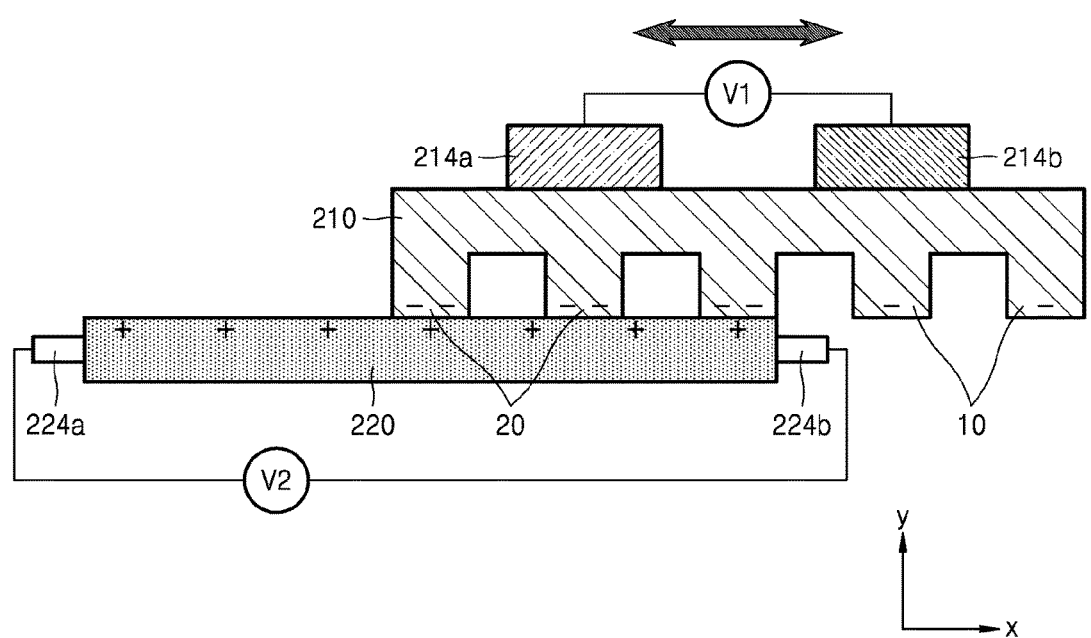
FIG. 5 illustrates an example of generating, by the energy harvester of FIG. 4, electrical energy.

FIG. 5 illustrates an example of generating, by the energy harvester of FIG. 4, electrical energy.

Referring to FIG. 5, at least one of the first friction member 210 and the second friction member 220 may slide along opposite surfaces of the first friction member 210 and the second friction member 220, thereby causing friction. For example, at least one of the first friction member 210 and the second friction member 220 may move in a direction substantially parallel to the x-axis of FIG. 5. In this case, the first friction member 210 may be fixed, and only the second friction member 220 may move in the direction substantially parallel to the x-axis. Reversely, the second friction member 220 may be fixed, and only the first friction member 210 may move in the direction substantially parallel to the x-axis. Alternatively, both of the first friction member 210 and the second friction member 220 may move in the direction substantially parallel to the x-axis. In this regard, the description, "may move in a (or the) direction substantially parallel to the x-axis" has to be construed as meaning that it is sufficient as long as a moving direction component includes an x-axis component. That is, the moving direction component is not limited to including only the x-axis component. For example, at least one of the first friction member 210 and the second friction member 220 may move in the x-axis direction and at the same time, may move in the y-axis direction or in a direction substantially perpendicular both to the x-axis and the y-axis.

As illustrated in FIG. 5, when the first friction member 210 moves along the opposite surfaces of the first friction member 210 and the second friction member 220, electrification charges may be induced in surfaces of the protrusions of the first friction member 210. In this regard, right protrusions 10 of FIG. 5 may be farther apart from the second friction member 220 compared to left protrusions 20. Due to this, surfaces of the right protrusions 10 may have a smaller amount of electrification charges than surfaces of the left protrusions 20. A potential difference may occur between the third electrode 214b on the right and the third electrode 214a on the left due to a difference in an amount of electrification charges between the surfaces of the right protrusions 10 and the surfaces of the left protrusions 20. Also, electrical energy may be produced from the potential difference between the third electrodes 214a and 214b.

When the first friction member 210 and the second friction member 220 cause frictions, a temperature of the second friction member 220 may increase. When the temperature of the second friction member 220 increases, as illustrated in FIG. 5, in a pyroelectric material of the second friction member 220, polarization may occur in a direction substantially parallel to the x-axis. Due to the polarization, for example, positive (+) charge may be induced in one end of the second friction member 220, and negative (−) charge may be induced in the other end of the second friction member 220. The second electrode 224b provided on a side of the second friction member 220 where the positive (+) charge has been induced may have a higher potential than the first electrode 224a provided on a side of the second friction member 220 where the negative (−) charge has been induced. Accordingly, an electric current may flow from the second electrode 224b to the first electrode 224a, thereby producing or generating electrical energy. Also, when a temperature of the second friction member 220 decreases when the first friction member 210 and the second friction member 220 cause no friction, an amount of electric charges induced in the two ends of the second friction member 220 may decrease. As such, a potential difference may occur again between the first electrode 224a and the second electrode 224b, thereby producing or generating electrical energy.

Figure 6:
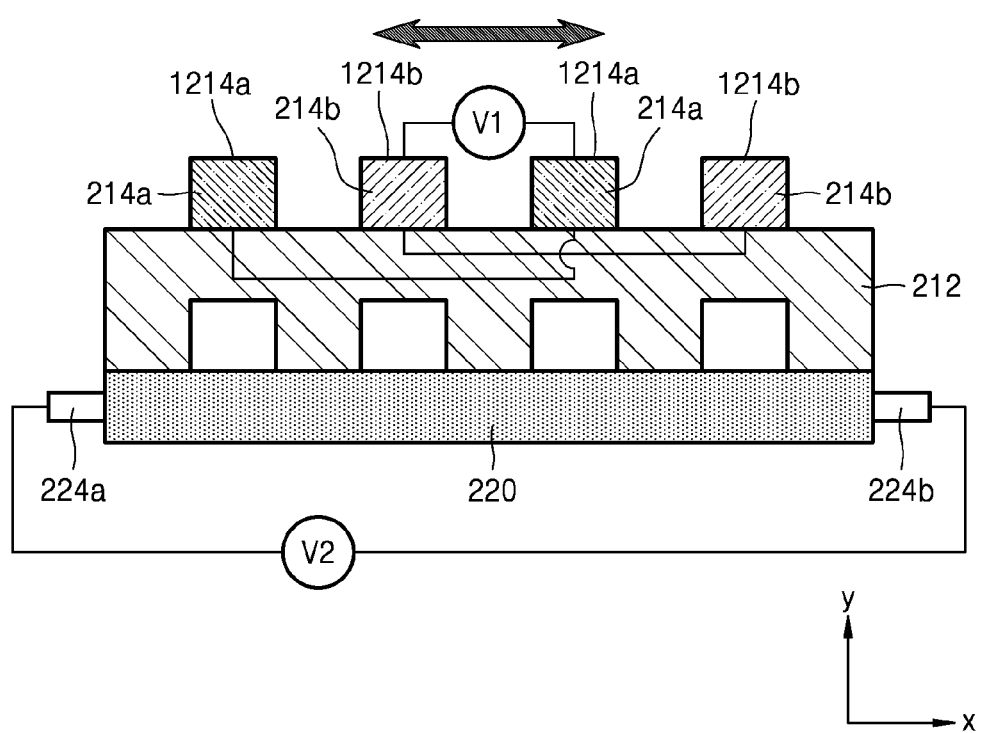
FIG. 6 is a cross-sectional view of an energy harvester according to another exemplary embodiment.

FIG. 6 illustrates an example in which the third electrodes 214a and 214b of the energy harvester illustrated in FIGS. 4 and 5 further include a plurality of first sub-electrodes 1214a and a plurality of second sub-electrodes 1214b. A description of an exemplary embodiment of FIG. 6 that has already been made with reference to FIGS. 4 and 5 will be omitted below.

Referring to FIG. 6, the third electrodes 214a and 214b may be provided on the first friction member 210. Also, the third electrodes 214a and 214b may include the first sub-electrodes 1214a electrically connected to each other and the second sub-electrodes 1214b disposed between the first sub-electrodes 1214a and electrically connected to each other. The first sub-electrode 1214a and the second sub-electrode 1214b may be disposed side by side with an arrangement direction of protrusions in a dielectric layer of the first friction member 210. Also, the first sub-electrodes 1214a and the second sub-electrodes 1214b may be electrically insulated from each other.

In FIG. 6, the first sub-electrodes 1214a may be arranged in a sequence of odd numbers, and the second sub-electrodes 1214b may be arranged in a sequence of even numbers. However, arrangement sequences of the first sub-electrode 1214a and the second sub-electrode 1214b are not limited thereto and may be changed. As the first sub-electrodes 1214a are electrically connected to each other, the first sub-electrodes 1214a may have the same potential as each other. Also, as the second sub-electrodes 1214b are electrically connected to each other, the second sub-electrodes 1214b may have the same potential as each other. On the contrary, as the first sub-electrodes 1214a and the second sub-electrodes 1214b are electrically insulated from each other, the first sub-electrodes 1214a and the second sub-electrodes 1214b may have different potentials from each other. Therefore, when triboelectrification occurs between the first friction member 210 and the second friction member 220, a potential difference may occur between the first sub-electrodes 1214a and the second sub-electrodes 1214b. Also, electrical energy may be generated from the potential difference.

Figure 7:
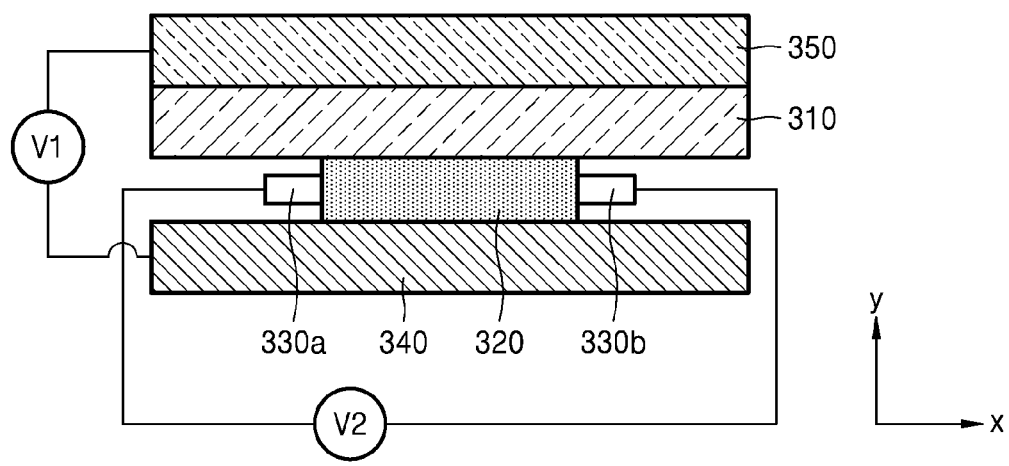
FIG. 7 is a cross-sectional view of an energy harvester according to another exemplary embodiment.

FIG. 7 is a cross-sectional view of an energy harvester according to another exemplary embodiment.

Referring to FIG. 7, the energy harvester according to the present exemplary embodiment may include a first friction member 310 and a second friction member 320. The first friction member 310 may include a dielectric. The second friction member 320 may include a pyroelectric material. Also, a first electrode 330a and a second electrode 330b may be provided on both end portions of the second friction member 320. Also, a third electrode 350 may be provided on the first friction member 310, and a fourth electrode 340 may be provided under the second friction member 320.

At least one of the first friction member 310 and the second friction members 320 may slide along opposite surfaces of the first friction member 310 and the second friction members 320, thereby causing friction. Alternatively, at least one of the first friction member 310 and the second friction members 320 may move in a direction substantially perpendicular to the opposite surfaces of the first friction member 310 and the second friction members 320 (in the y-axis direction) and thus may repeat contact and non-contact, thereby causing friction.

As the first friction member 310 and the second friction member 320 cause frictions, triboelectrification may occur. Due to the triboelectrification, a potential difference may occur between the third electrode 350 and the fourth electrode 340, and due to the potential difference, electrical energy may be generated. The first friction member 310 may include a dielectric having an electrification rate different from that of the pyroelectric material of the second friction member 320. Accordingly, when the first friction member 310 and the second friction members 320 cause friction, one of the first friction member 310 and the second friction members 320 may be positively electrified or energized, and the other may be negatively electrified or energized.

The second friction member 320 including the pyroelectric material may convert frictional heat generated by friction of the first friction member 310 and the second friction members 320 into electrical energy. When a temperature of the second friction member 320 changes due to frictional heat, electric charges having different polarities from each other may be respectively induced in the two end portions of the second friction member 320. Due to this, a potential difference may occur between the first electrode 330a and the second electrode 330b provided on the two end portions of the second friction member 320, thereby generating electrical energy.

Figure 8:
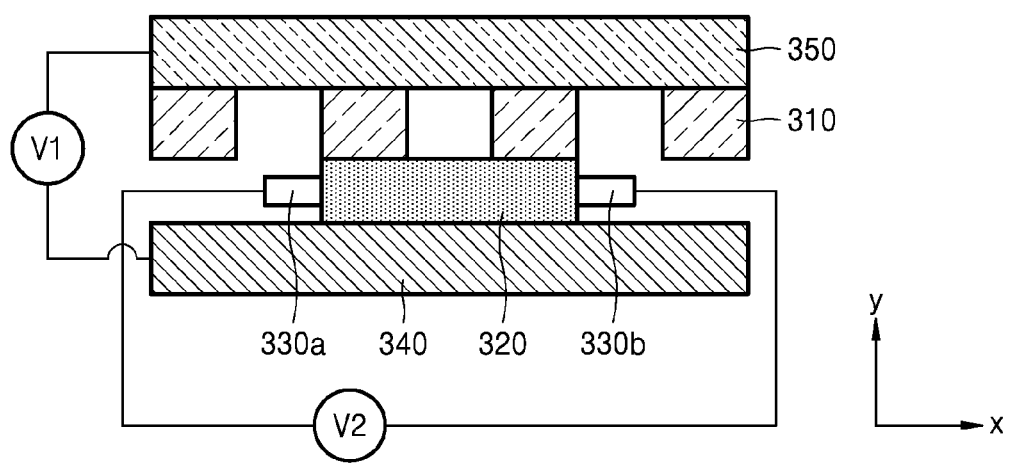
FIG. 8 is a cross-sectional view of an energy harvester according to another exemplary embodiment.

FIG. 8 illustrates a modified example of the first friction member 310 in the energy harvester illustrated in FIG. 7. A description of an exemplary embodiment of FIG. 8 that has already been made with reference to FIG. 7 will be omitted below.

Referring to FIG. 8, the first friction member 310 may include a plurality of dielectric layers. The dielectric layers included in the first friction member 310 may all include identical dielectrics or may include different types of dielectrics from each other. When the first friction member 310 includes the dielectric layers, as the amount of electrification charges of each of the dielectric layers changes, an electric current may flow between the third electrode 350 and the fourth electrode 340.

Figure 9:
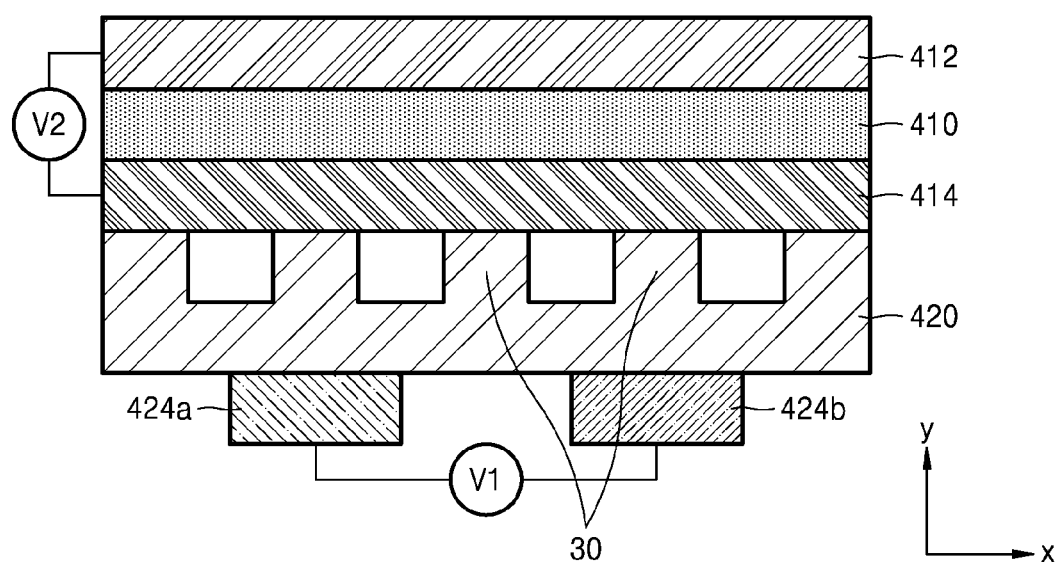
FIG. 9 is a cross-sectional view of an energy harvester according to another exemplary embodiment.

FIG. 9 is a cross-sectional view of an energy harvester according to another exemplary embodiment.

Referring to FIG. 9, the energy harvester may include a pyroelectric material layer 410 generating electrical energy by using frictional heat and a first electrode 412 and a second electrode 414 respectively provided on both surfaces of the pyroelectric material layer 410. Also, the energy harvester may include a friction member (which may include a first dielectric layer 420) generating electrical energy by causing friction with the second electrode 414 and a plurality of third electrodes 424a and 424b provided under the friction member in the form of the first dielectric layer 420.

The pyroelectric material layer 410 may include pyroelectric materials such as PVDF, PVC, PVF, TGS, PZT, PST, $LiTaO_3$, $BaTiO_3$, polymer-ceramic composites, and ZnO, but is not limited thereto. Also, the pyroelectric material layer 410 may be in a form of a nanoparticle, a nanowire, or a nanotube, may be in a form including the nanoparticle, the nanowire, and the nanotube, or may have a structure in which a specific surface area having a surface texturing shape is large in order to quickly react to temperature changes. The above-described materials are just examples, and the pyroelectric material layer 410 is not limited thereto. When a temperature of the pyroelectric material layer 410 changes due to frictional heat, electric charges having different polarities from each other may be induced in both end portions of the pyroelectric material layer 410 that are in contact with the first electrode 412 and the second electrode 414. That is, at the pyroelectric material layer 410, due to frictional heat, polarization may occur in a direction substantially parallel to a direction (the y-axis) in which the first electrode 412 and the second electrode 414 are arranged. When the polarization occurs, a dipole moment may be arranged in the direction substantially parallel to the y-axis at the pyroelectric material layer 410. Electric charges having different polarities from each other may be induced in the two end portions of the pyroelectric material layer 410, and thus, a potential difference may occur between the first electrode 412 and the second electrode 414, thereby producing electrical energy.

The friction member may include the first dielectric layer 420. The first dielectric layer 420 may include at least one of a piezoelectric material, a ferroelectric material, an EAP, and a pyroelectric material, and is not limited thereto. Also, the first dielectric layer 420 may include, for example, polyformaldehyde, ethylcellulose, polyamide, wool, silk, paper, cotton, steel, wood, PVA, silicon rubber, Teflon, PDMS, Kapton, PE, PVC, a fluoropolymer (e.g., PVF), PVDF, PTFE, PCTFE, PFA, FEP, ETFE, PP, PET, quartz, PZT, ZnO, and BTO, but is not limited thereto.

The second electrode 414 may include a metal. The metal may include at least one of Al, Mg, Cu, lead, Fe, Ni, Ag, Pt, Au, and an alloy thereof, but is not limited thereto. The friction member may include the first dielectric layer 420 in which a plurality of protrusions 30 are formed. In the first dielectric layer 420, the protrusions 30 may be formed in a direction of facing the second electrode 414. As the second electrode 414 and the first dielectric layer 420 move in a direction parallel to the x-axis or in the direction parallel to the y-axis, triboelectrification may occur between the second electrode 414 including the metal and the first dielectric layer 420.

When the first dielectric layer 420 and the second electrode 414 move in the direction substantially parallel to the x-axis, the protrusions 30 may have different amounts of electrification charges from each other. Thus, a potential difference may occur between the third electrodes 424a and 424b, thereby producing electrical energy. Although FIG. 9 illustrates a case in which the third electrodes 424a and 424b are two, this is just an example, and the number of the third electrodes 424a and 424b is not limited thereto.

Figure 10:
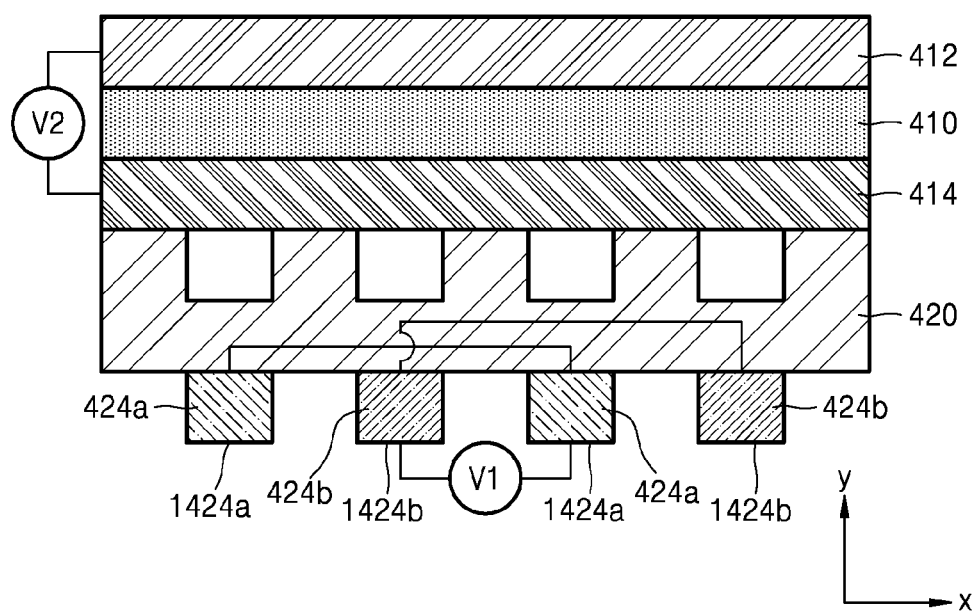
FIG. 10 is a cross-sectional view of an energy harvester according to another exemplary embodiment.

FIG. 10 illustrates an example in which the third electrodes 424a and 424b of the energy harvester illustrated in FIG. 9 further include a plurality of first sub-electrodes 1424a and a plurality of second sub-electrodes 1424b. A description of an exemplary embodiment of FIG. 10 that has already been made with reference to FIG. 9 will be omitted below.

Referring to FIG. 10, the third electrodes 424a and 424b may be provided on the friction member in the form of the first dielectric layer 420. Also, the third electrodes 424a and 424b may further include the first sub-electrodes 1424a electrically connected to each other and the second sub-electrodes 1424b disposed between the first sub-electrodes 1424a and electrically connected to each other. The first sub-electrode 1424a and the second sub-electrode 1424b may be disposed side by side with an arrangement direction of protrusions in the first dielectric layer 420 of the friction member. Also, the first sub-electrodes 1424a and the second sub-electrodes 1424b may be electrically insulated from each other.

In FIG. 10, the first sub-electrodes 1424a may be arranged in a sequence of odd numbers, and the second sub-electrodes 1424b may be arranged in a sequence of even numbers. However, arrangement sequences of the first sub-electrode 1424a and the second sub-electrode 1424b are not limited thereto and may be changed. As the first sub-electrodes 1424a are electrically connected to each other, the first sub-electrodes 1424a may have the same potential as each other. Also, as the second sub-electrodes 1424b are electrically connected to each other, the second sub-electrodes 1424b may have the same potential as each other. On the contrary, as the first sub-electrodes 1424a and the second sub-electrodes 1424b are electrically insulated from each other, the first sub-electrodes 1424a and the second sub-electrodes 1424b may have different potentials from each other. Therefore, when triboelectrification occurs between the second electrode 414 and the friction member in the form of the first dielectric layer 420, a potential difference may occur between the first sub-electrodes 1424a and the second sub-electrodes 1424b. Also, electrical energy may be produced from the potential difference.

Figure 11:
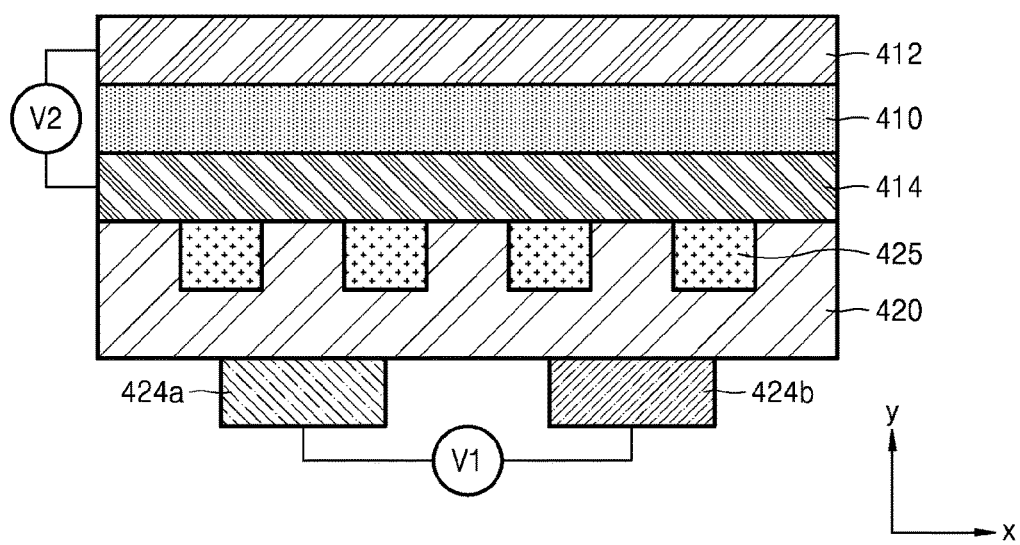
FIG. 11 is a cross-sectional view of an energy harvester according to another exemplary embodiment.

FIG. 11 illustrates an example in which the energy harvester illustrated in FIG. 9 further includes a plurality of second dielectric layers 425 between protrusions of the first dielectric layer 420.

Referring to FIG. 11, the friction member includes a plurality of second dielectric layers 425 arranged between the protrusions of the first dielectric layer 420. The second dielectric layers 425 may be further provided between the protrusions of the first dielectric layer 420. The second dielectric layers 425 may have an electrification rate different from that of the first dielectric layer 420. Also, for example, when the second dielectric layers 425 and the first dielectric layer 420 cause triboelectrification with the second electrode 414, the second dielectric layer 425 and the first dielectric layer 420 may be electrified or energized to have different polarities from each other. When the second dielectric layers 425 and the first dielectric layer 420 are electrified or energized to have different polarities from each other, a voltage between the third electrodes 424a and 424b may change more quickly and drastically when triboelectrification occurs between the first dielectric layer 420 and the second dielectric layer 425 and the second electrode 414. Thus, more electrical energy may be produced between the third electrodes 424a and 424b.

One of the first dielectric layer 420 and the second dielectric layer 425 may include a material easy to electrify positively, and the other may include a material easy to electrify negatively. Examples of the material easy to electrify positively may include polyformaldehyde, etylcellulose, polyamide, wool, silk, Al, paper, cotton, steel, wood, Ni, Cu, Ag, or PVA. Also, examples of the material easy to electrify negatively may include silicone rubber, Teflon, PDMS, Kapton, PP, PE, PVC, a ferroelectric, or a piezoelectric material such as an electret. In this regard, the electret may include, for example, a flouropolymer, PVF, PVDF, PCTFE, PFA, FEP, ETFE, PET, or quartz. The above-described materials are just examples, and the material easy to electrify positively and the material easy to electrify negatively are not limited thereto.

FIG. 11 illustrates a case in which the third electrodes 424a and 424b include two electrodes. However, the number of the third electrodes 424a and 424b is not limited thereto, and the third electrodes 424a and 424b of FIG. 11 may include a plurality of first sub-electrodes and a plurality of second sub-electrodes as in FIG. 10.

An energy harvester according to exemplary embodiments has been described above with reference to FIGS. 1 to 11. While an energy harvester according to the above-described exemplary embodiments produces electrical energy by triboelectrification, the energy harvester may convert frictional heat due to friction into electrical energy, thereby implementing a hybrid electricity-generating method. An energy harvester described with reference to FIGS. 1 to 11 may be accommodated in a case.

Figure 12:
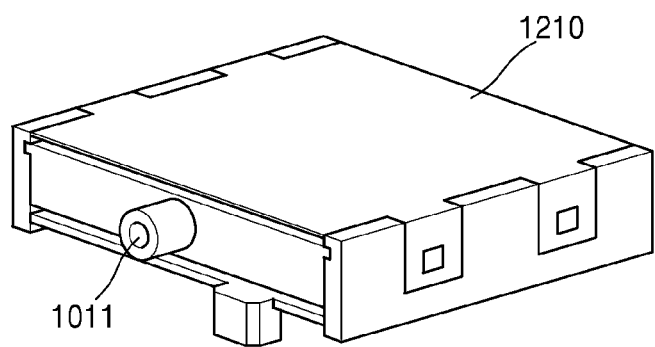
FIG. 12 is a perspective view illustrating an example of a case for accommodating an energy harvester described with reference to FIGS. 1 to 11.

FIG. 12 is a perspective view in which an example of a case 1210 for accommodating the energy harvester described with reference to FIGS. 1 to 11 is illustrated.

Referring to FIG. 12, the case 1210 may accommodate or embed an energy harvester according to the exemplary embodiments illustrated in FIGS. 1 to 11. In the case 1210, the energy harvester may produce or generate electrical energy by triboelectrification. Also, a temperature of a pyroelectric material of the energy harvester may change due to frictional heat, thereby producing or generating electrical energy. A cable conduit 1011 for transferring electrical energy generated from the energy harvester may be provided at the case 1210. An energy harvester according to exemplary embodiments may be accommodated in a case illustrated in FIG. 12 and mounted in a mobile device, a wearable device, an apparatus for generating hydroelectric power or wind power, or the like.

Figure 13:
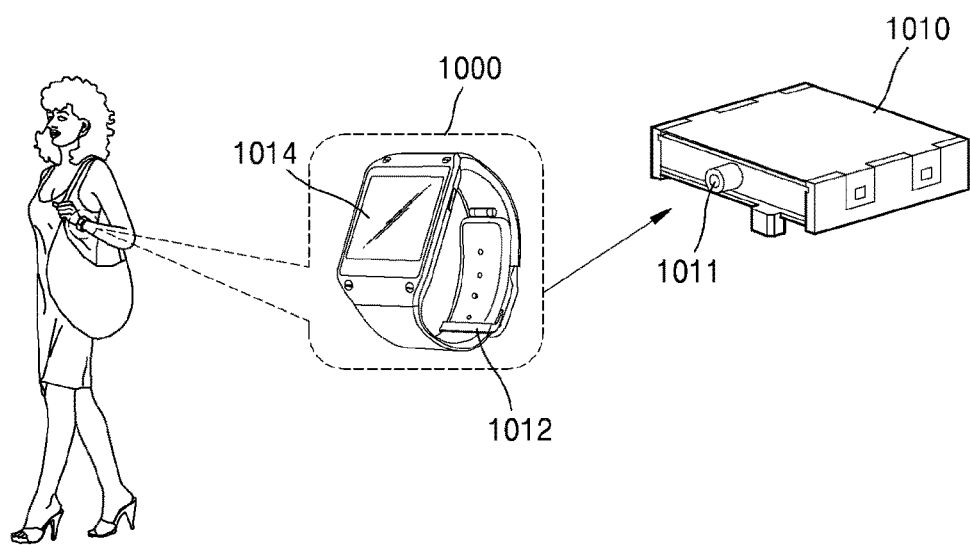
FIG. 13 illustrates a smartwatch including an energy harvester, according to another exemplary embodiment.

The energy harvester illustrated in FIGS. 1 to 11 may be mounted in a mobile device or a wearable apparatus and used as a power supply source. FIG. 13 illustrates a smartwatch 1000 including an energy harvester according to exemplary embodiments.

Referring to FIG. 13, the smartwatch 1000 may include an energy harvester 1010 embedded in a case (similar to the case 1210 of FIG. 12) described with reference to FIGS. 1 to 11. Although FIG. 13 illustrates a case accommodating an energy harvester, which is illustrated in FIG. 12, as an example, exemplary embodiments are not limited thereto. The energy harvester 1010 may be mounted in a buckle 1012 of the smartwatch 1000. However, this is just an example, and a place in which the energy harvester 1010 is mounted may be changed. For example, the energy harvester 1010 may be mounted in a main body 1014 of the smartwatch 1000. When the energy harvester 1010 is mounted in the smartwatch 1000, relative movements between a first electrification member and a second electrification member may occur because of an inertial force due to a user's motion of shaking his or her arm. Thus, the smartwatch 1000 may be continuously charged with electrical energy. Also, frictional heat generated by triboelectrification may be converted into electrical energy, and thus, electrical energy generation efficiency may be increased.

Electrical energy generated from the energy harvester 1010 may be transferred to another device of the smartwatch 1000. Examples of the other device may include a charging battery, a sensor, and a display, but are not limited thereto. For example, a cable hole 1011 may be provided at the energy harvester 1010, and through a wire connected thereto, electrical energy may be transferred to other devices of the smartwatch 1000. For efficient energy transfer, the smartwatch 1000 may include a transmission circuit for transmitting electrical energy.

Figure 14:
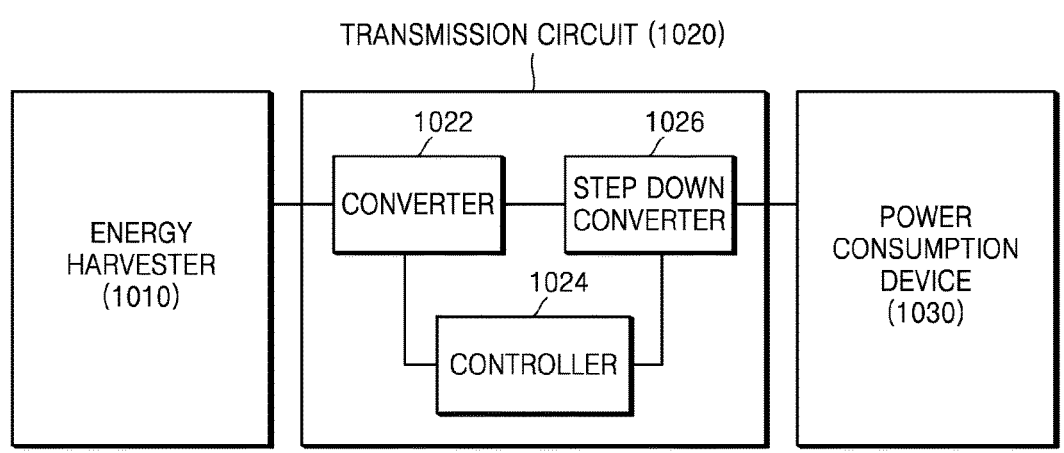
FIG. 14 illustrates an example of a transmission circuit which may be included in a smartwatch, according to another exemplary embodiment.

FIG. 14 illustrates an example of a transmission circuit 1020 which may be included in the smartwatch 1000. Referring to FIG. 14, the transmission circuit 1020 may include a converter 1022 converting an electric signal in the form of an alternating current (AC) into that in the form of a direct current (DC). Also, the transmission circuit 1020 may include a controller 1024 adjusting impedance of the transmission circuit 1020 such that a transmission rate of power transmitted to a power consumption device 1030 from the energy harvester 1010. The controller 1024 may include a variable resistor and the like and adjust impedance of the transmission circuit 1020. Thus, the impedance of the transmission circuit 1020 may be matched such that a transfer rate of electrical energy transferred to the power consumption device 1030 through the transmission circuit 1020 is increased. The transmission circuit 1020 may include a step down converter 1026 decreasing, when a level of a DC voltage obtained by the converting of the converter 1022 is excessively high, the level of the DC voltage. The step down converter may curb excessive electric signal occurrence and protect other devices.

Although the smartwatch 1000 has been described above as an example of a wearable device, exemplary embodiments are not limited thereto. For example, the energy harvester may be included in a cellular phone, a radio, a biosensor, a position sensor, a temperature sensor, a blood sensor, or the like and used to supply power. The energy harvester may be mounted in a mobile device worn on a part of the human body that moves all the time, such as an arm or a leg, to convert kinetic energy according to movement of the arm or the leg into electrical energy. Besides, the energy harvester may be mounted in a mechanical apparatus to convert vibration of the mechanical apparatus into electrical energy. Also, the energy harvester may use vibration generated by wind, pressure, flow of a sound fluid, or the like to generate electrical energy.

According to exemplary embodiments, when an external force is applied to the energy harvester, friction members may cause friction and thus generate electrical energy. Also, frictional heat generated between the friction members may be converted into electrical energy. Thus, the energy harvester capable of hybrid electricity-generation may be provided. Also, when the energy harvester is mounted in a portable device, the portable device may be continuously charged with energy.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. An energy harvester comprising:
a first friction member; and
a second friction member arranged to face the first friction member and configured to generate electrical energy by causing friction with the first friction member,
wherein at least one selected from the first friction member and the second friction member comprises a pyroelectric material configured to convert frictional heat generated due to friction of the first and second friction members into electrical energy.

2. The energy harvester of claim 1, wherein at least one selected from the first and second friction members slides along opposite surfaces of the first and second friction members, thereby causing friction.

3. The energy harvester of claim 1, wherein at least one selected from the first and second friction members moves in a direction substantially perpendicular to opposite surfaces of the first and second friction members and thus repeats contact and non-contact, thereby causing friction.

4. The energy harvester of claim 1, wherein the second friction member comprises the pyroelectric material, and a first electrode and a second electrode are respectively arranged on both end portions of the second friction member.

5. The energy harvester of claim 4, wherein the second friction member is configured such that polarization occurs, due to frictional heat, in a direction substantially parallel to opposite surfaces of the first and second friction members.

6. The energy harvester of claim 5, wherein the first friction member comprises a metal, and a third electrode is arranged on the second friction member.

7. The energy harvester of claim 5, wherein the first friction member comprises a dielectric layer in which a plurality of protrusions are formed in a direction facing the second friction member, and a plurality of third electrodes are arranged on the first friction member.

8. The energy harvester of claim 7, wherein the third electrodes comprise a plurality of first sub-electrodes electrically connected to each other, and a plurality of second sub-electrodes arranged between the first sub-electrodes and electrically connected to each other.

9. The energy harvester of claim 5, wherein the first friction member comprises a dielectric layer, a third electrode is arranged on the first friction member, and a fourth electrode is arranged on the second friction member.

10. An energy harvester comprising:
a pyroelectric material layer configured to generate electrical energy by frictional heat;
a first electrode and a second electrode respectively arranged on both surfaces of the pyroelectric material layer;
a friction member configured to generate electrical energy by causing friction with the second electrode; and
a plurality of third electrodes arranged on the friction member.

11. The energy harvester of claim 10, wherein the third electrodes comprise a plurality of first sub-electrodes electrically connected to each other, and a plurality of second sub-electrodes arranged between the first sub-electrodes and electrically connected to each other.

12. The energy harvester of claim 10, wherein the friction member comprises a first dielectric layer in which a plurality of protrusions are formed in a direction facing the second electrode.

13. The energy harvester of claim 12, wherein the friction member comprises a plurality of second dielectric layers arranged between the protrusions of the first dielectric layer and having an electrification rate different from that of the first dielectric layer.

14. The energy harvester of claim 10, wherein the pyroelectric material layer comprises at least one selected from poly vinylidene fluoride (PVDF), poly(vinyl chloride) (PVC), polyvinyl fluoride (PVF), tri glycerin sulphate (TGS), lead zirconate titanate (PZT), lead stannic titanate (PST), lithium tantalate (LiTaO$_3$), barium titanate (BaTiO$_3$), polymer-ceramic composites, and zinc oxide (ZnO).

15. The energy harvester of claim 14, wherein, in order to quickly react to temperature changes, the pyroelectric material layer is in a form of a nanoparticle, a nanowire, or a nanotube, is in a form comprising the nanoparticle, the nanowire, and the nanotube, or has a structure in which a specific surface area having a surface texturing shape is large.

16. A smartwatch comprising:
an energy harvester comprising a first friction member, and a second friction member arranged to face the first friction member and configured to generate electrical energy by causing friction with the first friction member; and
a transmission circuit configured to transmit the electrical energy generated from the energy harvester to outside of the energy harvester,
wherein at least one selected from the first friction member and the second friction member comprises a pyroelectric material configured to convert frictional heat generated due to friction of the first and second friction members into electrical energy.

17. The smartwatch of claim 16, wherein the transmission circuit comprises a converter configured to convert an alternating current (AC) signal into a direct current (DC) signal, a controller configured to adjust impedance of the transmission circuit such that a transmission rate of power transmitted through the transmission circuit is increased, and a step down converter configured to adjust a level of a DC voltage obtained by the converting performed by the converter.

18. The smartwatch of claim 16, wherein the second friction member comprises the pyroelectric material, and a first electrode and a second electrode are respectively arranged on both end portions of the second friction member.

19. A smartwatch comprising:
an energy harvester comprising a pyroelectric material layer configured to generate electrical energy by frictional heat, a first electrode and a second electrode respectively arranged on both surfaces of the pyroelectric material layer, a friction member configured to generate electrical energy by causing friction with the second electrode, and a plurality of third electrodes arranged on the friction member; and
a transmission circuit configured to transmit the electrical energy generated from the energy harvester to outside of the energy harvester.

20. The smartwatch of claim 19, wherein the transmission circuit comprises a converter configured to convert an alternating current (AC) signal into a direct current (DC) signal, a controller configured to adjust impedance of the transmission circuit such that a transmission rate of power transmitted through the transmission circuit is increased, and a step down converter configured to adjust a level of a DC voltage obtained by the converting performed by the converter.

* * * * *